United States Patent
Wochner et al.

(10) Patent No.: US 9,421,584 B2
(45) Date of Patent: Aug. 23, 2016

(54) METHOD FOR PURIFYING POLYCRYSTALLINE SILICON

(71) Applicant: Wacker Chemie AG, Munich (DE)

(72) Inventors: Hanns Wochner, Burghausen (DE); Christian Gossmann, Emmerting (DE); Herbert Lindner, Ostermiething (AT)

(73) Assignee: WACKER CHEMIE AG, Munich (DE)

( * ) Notice: Subject to any disclaimer, the term of this patent is extended or adjusted under 35 U.S.C. 154(b) by 0 days.

(21) Appl. No.: 14/535,975

(22) Filed: Nov. 7, 2014

(65) Prior Publication Data
US 2015/0075559 A1    Mar. 19, 2015

Related U.S. Application Data

(63) Continuation of application No. 12/675,297, filed as application No. PCT/EP2008/060425 on Aug. 8, 2008, now abandoned.

(30) Foreign Application Priority Data

Aug. 29, 2007   (DE) .......................... 10 2007 040 851

(51) Int. Cl.
| | |
|---|---|
| *C01B 33/037* | (2006.01) |
| *B08B 3/08* | (2006.01) |
| *C01B 33/00* | (2006.01) |
| *H01L 21/67* | (2006.01) |

(52) U.S. Cl.
CPC . *B08B 3/08* (2013.01); *C01B 33/00* (2013.01); *C01B 33/037* (2013.01); *H01L 21/67057* (2013.01)

(58) Field of Classification Search
CPC .................................................. C01B 33/037
See application file for complete search history.

(56) References Cited

U.S. PATENT DOCUMENTS

| | | |
|---|---|---|
| 4,403,735 A | 9/1983 | Weaver |
| 4,588,571 A | 5/1986 | Bildl et al. |
| 5,421,883 A | 6/1995 | Bowden |
| 5,820,688 A | 10/1998 | Koppl et al. |
| 5,846,921 A | 12/1998 | Gil et al. |
| 5,927,304 A | 7/1999 | Wen |
| 6,021,789 A | 2/2000 | Akatsu et al. |
| 6,100,203 A | 8/2000 | Kil et al. |
| 6,309,467 B1 | 10/2001 | Wochner et al. |
| 6,369,008 B1 | 4/2002 | Ha et al. |
| 6,506,260 B1 * | 1/2003 | Hiraishi ............ H01L 21/67046 134/1 |

(Continued)

FOREIGN PATENT DOCUMENTS

| | | |
|---|---|---|
| DE | 3317286 A1 | 11/1984 |
| DE | 19529518 A1 | 2/1996 |

(Continued)

OTHER PUBLICATIONS

"Theory and Method of Silicon Wafer Cleaning," Liu Chauanjun et al, Semiconductor Information, vol. 37, No. 2, pp. 30-36, published in Apr. 2000 in Chinese including the English Abstract.

*Primary Examiner* — Michael Kornakov
*Assistant Examiner* — Ryan Coleman
(74) *Attorney, Agent, or Firm* — Brooks Kushman P.C.

(57) ABSTRACT

Polysilicon fragments are purified to remove metal contaminates by contacting the fragments with a purifying liquid at a flow rate >100 mm/sec. Effective removal without abrasion is accomplished.

2 Claims, 3 Drawing Sheets

(56) References Cited

U.S. PATENT DOCUMENTS

| | | |
|---|---|---|
| 2003/0168087 A1* | 9/2003 | Inui .................... A47L 15/4223 134/57 D |
| 2005/0139231 A1* | 6/2005 | Abadie .................... B08B 3/08 134/2 |
| 2006/0042539 A1 | 3/2006 | Ohta |
| 2007/0221254 A1 | 9/2007 | Izumi et al. |
| 2008/0006293 A1 | 1/2008 | Wochner et al. |
| 2008/0053815 A1 | 3/2008 | Wochner et al. |
| 2008/0105286 A1 | 5/2008 | Kizawa et al. |

FOREIGN PATENT DOCUMENTS

| | | |
|---|---|---|
| DE | 19817486 A1 | 1/1999 |
| DE | 69905538 T2 | 11/2003 |
| EP | 0905796 A1 | 3/1999 |
| EP | 1876143 A1 | 1/2008 |
| EP | 1894887 A2 | 3/2008 |
| JP | 7094459 A | 4/1995 |
| JP | 8117645 A | 5/1996 |
| JP | 10041271 A | 2/1998 |
| JP | 11168076 A | 6/1999 |
| JP | 2006108512 A | 4/2006 |

* cited by examiner

US 9,421,584 B2

METHOD FOR PURIFYING POLYCRYSTALLINE SILICON

CROSS-REFERENCE TO RELATED APPLICATIONS

This application is a continuation of U.S. patent application Ser. No. 12/675,297, filed Feb. 25, 2010 (pending), which is the U.S. national phase of PCT Appln. No. PCT/EP2008/060425 filed Aug. 8, 2008, which claims priority to German application DE 10 2007 040 851.1 filed Aug. 29, 2007, all of which are incorporated herein by reference.

BACKGROUND OF THE INVENTION

1. Field of the Invention

The invention relates to a method for purifying polycrystalline silicon with an improved flow of the purifying solutions in the process.

2. Description of the Related Art

High-purity semiconductor material is required for the production of solar cells or electronic components, such as memory elements or microprocessors for example. The dopants introduced in a targeted manner are the only impurities that a material of this type should have in the most expedient case. Therefore, endeavors are made to keep the concentrations of harmful impurities as low as possible. It is often observed that semiconductor material that has already been produced with high purity is contaminated again in the course of further processing to form the target products. Therefore, complicated purifying steps repeatedly become necessary in order to restore the original purity.

In particular, contamination by metal atoms should be regarded as critical since the latter can alter the electrical properties of the semiconductor material in a harmful manner. If the semiconductor material that is to be comminuted is comminuted, in the manner that has predominantly been customary heretofore, by means of mechanical tools, such as crushers made of steel, for example, then the fragments have to be subjected to surface purifying prior to melting.

In order to remove the impurities, by way of example, the surface of the mechanically processed polycrystalline silicon is etched using a mixture of nitric acid and hydrofluoric acid. In the course of the process, the metal particles are attacked to a great extent by the acid mixture during the preliminary purifying. Metal carbide residues remain, and are dissolved to the greatest possible extent during the HF/HNO$_3$ main purifying.

In this case, the polysilicon fragments are usually dipped successively into different purifying solutions during purifying in baskets or basins.

EP 0905796 describes a purifying process comprising preliminary purifying by means of a mixture comprising HF/HCl/H$_2$O$_2$, main purifying by means of HF/HNO$_3$ and subsequent hydrophilization of the silicon surface by means of HCl/H$_2$O$_2$. During the purifying process, rinsing takes place in throughflow or dump tanks. In this case, the silicon fragments are purified in a purifying machine on the basis of an up and down movement. In addition, the basin loaded with polysilicon fragments can also move completely out of the liquid during the lifting/lowering movement, in order that the purifying solution can completely drain away from the silicon fragments. A disadvantage that emerges is that spots having a gray appearance are found on the silicon fragments in the course of the process. Investigations have shown that the gray spots always occur at the contact points between individual poly fragments or between poly fragments and the process basin wall. The cause is excessively little flow in the dead water zones between the individual poly fragments. A further disadvantage in the method described is the undesirable residual acid concentration at the fragments. Despite greatly increasing the flow rate up to complete liquid exchange in the tank in less than one second, it has always been possible to detect tiny acid traces in the pptw range by means of ion chromatography and IC measurements on the purified poly fragments.

It is also known from the prior art to etch polysilicon rods (FZ rods) and thin rods in drum apparatuses. Although experiments on apparatuses of this type with poly fragments show that no superimposed spots arise at rotational speeds of greater than revolution per minute, the sharp-edged polysilicon fragments produce visible abrasion of the drum material even at a low rotational speed of the drum. This abrasion is unacceptable for subsequent application of the polysilicon fragments as semiconductor material.

US 2006/0042539 describes an apparatus in which the tray in the container is caused to effect a regulated translational movement in a lateral direction during the treatment duration. However, the translational movement leads to the same results as the lifting/lowering movement described in EP 0905 796. The problem of the dead water zone at the contact points cannot be solved with an apparatus of this type either.

DE 69905538 describes a centrifuge apparatus for purifying small parts. In this case, a rearrangement of the parts is achieved by means of a continual change between centrifugal force and gravitation. The centrifugal force takes effect at high rotational speed, and the gravitation at low rotational speed. The parts are continually rearranged as a result of this change. What is disadvantageous here, too, is that abrasion arises as a result of the relative movement with the vessel, the abrasion being unacceptable for semiconductor-conforming polysilicon fragments.

None of the solutions known from the prior art leads to useable results. If the etching devices are linked with rearrangement of the polysilicon fragments, unacceptable abrasion of the containers must always be reckoned with. Applications such as are known from the purifying and etching of semiconductor wafers cannot be employed owing to the different geometries of polysilicon fragments and wafers.

SUMMARY OF THE INVENTION

Therefore, the object was to provide an improved method for purifying polysilicon fragments in which no dead water zones occur and the formation of spots on the polysilicon fragments is thus prevented. At the same time, the rinsing capacity is intended to be high enough that acid residues are no longer detectable on the polysilicon fragments.

It has surprisingly been found that in the case of etching polysilicon with flow velocities onto the polysilicon surface of greater than 100 mm per second, impinging on the surface of the polysilicon fragments from more than two different directions, it is possible to increase the removal with the same acid concentration and, at the same time it has become possible to eliminate the arising of dead water zones and thus the cause of the spots.

DETAILED DESCRIPTION OF THE PREFERRED EMBODIMENTS

The invention relates to a method for purifying polysilicon fragments, characterized in that the flow of the purifying liquid in at least one of the process steps has a flow velocity of greater than 100 mm/sec, which impinges on the surface of the polysilicon fragments from more than two different directions.

The method according to the invention has made it possible to improve the substance exchange during the residence times of the polysilicon fragments in the purifying baths in such a way that no dead water zones arise in the bulk material and so spots no longer arise on the polysilicon fragments. It has become possible to significantly increase the etching removal with the same acid concentration.

Various arrangements are possible for producing a flow of greater than 100 mm/sec during the purifying process, which impinges on the surface of the polysilicon fragments from more than two different directions.

Figure 1:
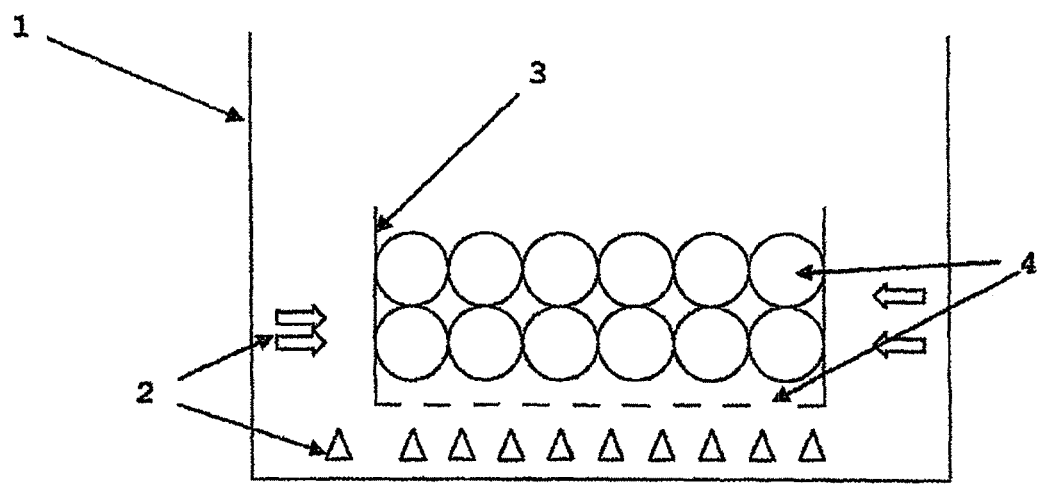
FIG. 1 describes one embodiment of the invention.

In one embodiment of the method according to the invention, the improvement in the flow conditions between the contact points of the individual fragments is obtained by means of non-directional, diffuse injection of the purifying liquid into the etching tank, by means of alternately active nozzles (FIG. 1). In this case, a plurality of nozzles for introducing the purifying liquid (2) are situated in the etching tank (1), said nozzles being fitted to the base and to the side walls. The bulk material is suspended on the sides and on the base in a basin (3) having openings (4) in the etching tank. Numbers of nozzles of between 1 and 1000 are preferred in this case. 10 to 100 nozzles are particularly preferred. The etching mixture emerges from said nozzles at a velocity of greater than 100 mm/sec. Flow velocities of 100 to 200 mm/sec are preferred, particularly most preferably 150 mm/sec.

The nozzles can be opened in a temporally staggered manner in an alternating cycle with a temporal delay of 0.1 to 60 sec for a time of 0.1 to 60 sec. Temporal delays of 1 to 4 sec and an adjustable opening time of 0.2 to 1 sec are preferred. The nozzles have an opening of 0.01 to 5 mm. An opening of 0.5 to 2 mm is preferably used. 50 nozzles having an exit diameter of 1 mm are particularly preferred. The alternate incident flow on the individual fragments prevents dead water zones from arising at the contact points between the poly fragments. A uniform flow velocity prevails at all points in the bulk material.

Figure 2:
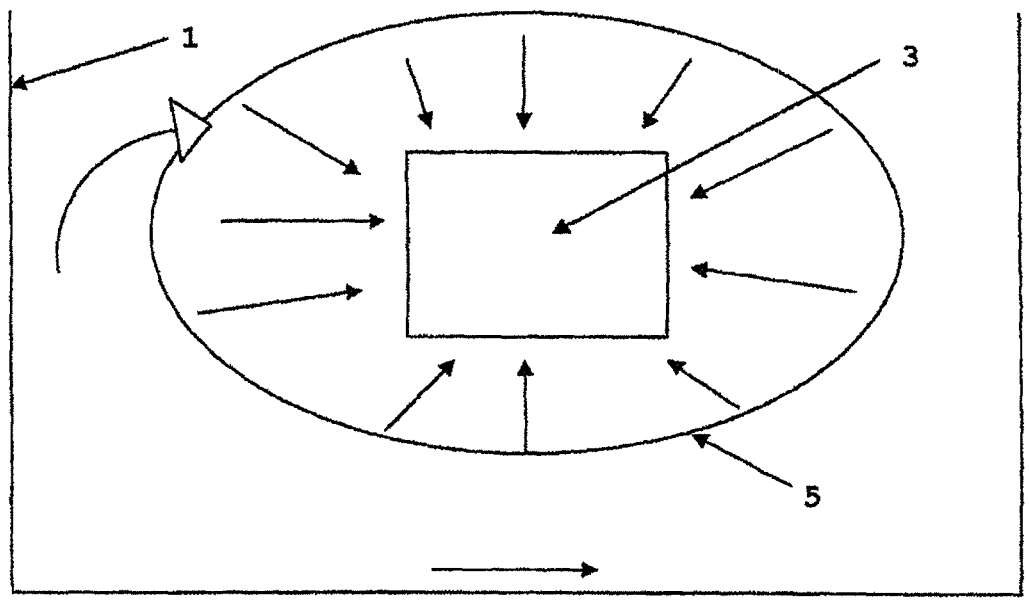
FIG. 2 describes a second embodiment of the invention.

In a further embodiment of the method according to the invention, the improvement in the flow conditions between the contact points of the individual fragments is produced by one or more moved nozzle rings in the etching tank (FIG. 2). In this case, moved, rotating nozzle rings (5) are arranged around the process basin (3). By varying the exit velocity from the nozzles, an incident flow of greater than 100 mm/sec from different directions on the fragments is obtained in the etching tank in this case. The nozzle rings preferably contain between 5 and 500 nozzles having an opening of 0.01 to 5 mm.

As in the embodiment already described above, the nozzles can also additionally be actuated with a temporal delay and an adjustable opening time. The times as described in the first embodiment are likewise preferred here. 10 to 100 nozzles having an opening of 0.01 to 5 mm are preferred. An opening of 0.5 to 2 mm is preferably used. 50 nozzles having an exit diameter of 1 mm are particularly preferred.

Figure 3:
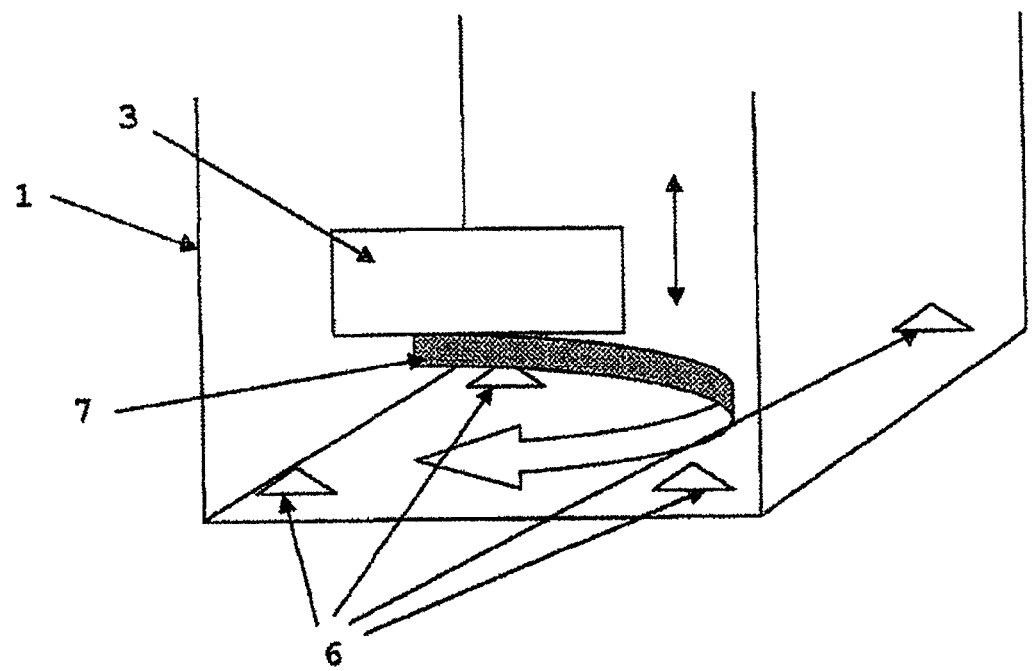
FIG. 3 describes a third embodiment of the invention.

In a further embodiment of the method according to the invention, the improvement in the flow conditions between the contact points of the individual fragments is produced by a so-called "principle of the rotating acid" (FIG. 3).

In this case, a plurality of nozzles (6) having an opening of 0.01 to 5 mm are arranged at the base of the etching tank (1) in such a way that the acid mixture is cause to effect a rotational movement. The etching mixture emerges from the nozzles at a velocity of greater than 100 mm/sec. Preference is given to nozzles having an opening of 0.5 mm to 4 mm, particularly more preferably of 1 mm, and an exit velocity of 100 mm/sec. The process basin (3) can rest in the rotating acid (7) or be moved by means of an additional lifting/lowering movement. Preference is given to an additional lifting/lowering movement in the case of which the process basin completely enters and exits from the liquid during each lifting/lowering movement.

Figure 4:
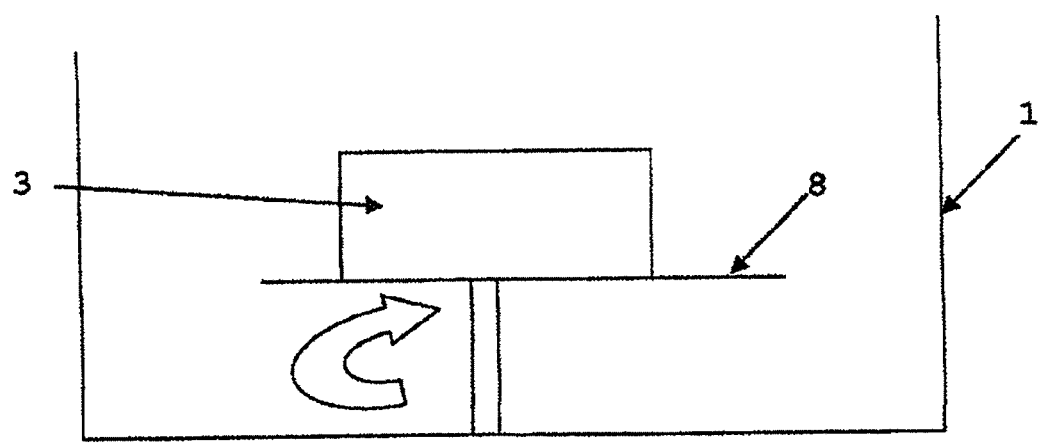
FIG. 4 describes a fourth embodiment of the invention.

In a further embodiment of the method according to the invention, the improvement in the flow conditions between the contact points of the individual fragments is produced by the application of a turntable which rotates in a horizontal plane and on which the process basin is situated (FIG. 4).

In this case, the rotational movement of the process basin (3) on the turntable (8) is preferably between 1 and 500 revolutions per minute. A sufficient incident flow on the polysilicon fragments from different directions is thus produced in the etching tank (1). A rotational speed of 20 to 100 revolutions per minute is particularly preferred, especially most preferably 50 revolutions per minute. The setting of the suitable rotational speed of the horizontal rotatary movement produces an incident flow from different directions onto the surface of the individual silicon fragments at a velocity of greater than 100 mm/sec.

Figure 5:
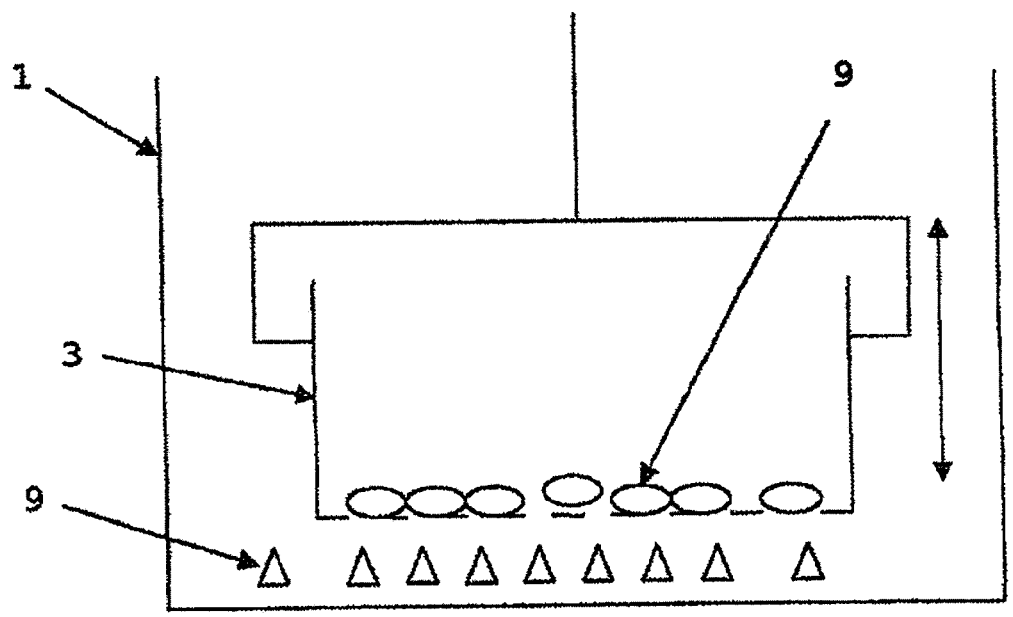
FIG. 5 describes a fifth embodiment of the invention.

In a further embodiment of the method according to the invention, the improvement in the flow conditions between the contact points of the individual fragments can also be achieved by additional, non-directional injection of air through the base of the basin (FIG. 5). This measure results in an increase in the flow velocity at the critical contact points of greater than 100 mm/sec. Preferably, 5 to 100 nozzles (9) are fitted to the base of the etching tank (1), from which nozzles the air is injected into the etching tank from below in the direction of the process basin (3) with the polysilicon fragments (9). The size of the opening of the nozzle outlets is preferably 0.01 to 5 mm. The pressure of the injected air is preferably between 0.1 and 200 bar. 20 to 100 nozzles having an opening of 0.1 to 1 mm nozzle opening are particularly preferred.

As in the embodiments described above, the nozzles can additionally also be actuated with a temporal delay and an adjustable opening time. Preference is given to the temporal delays and the opening times analogously to the embodiments already described. As a result of the additional turbulence produced by the injected air into the purifying solution, the acid can flow through unimpeded at all the contact points between the poly fragments.

Figure 6:
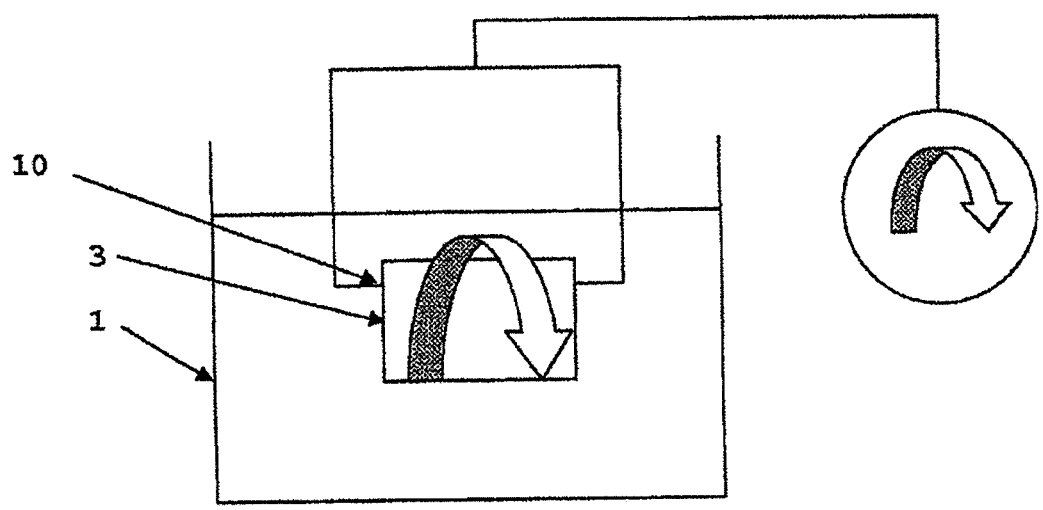
FIG. 6 describes a sixth embodiment of the invention.

In a further embodiment of the method according to the invention, the improvement in the flow conditions between the contact points of the individual fragments is produced by a process basin that moves on a vertical axis (FIG. 6).

For this purpose, the process basin (3) used is equipped with lateral holes (10) and is led through the etching bath on a vertical circular path. In this case, a circular movement with a frequency of 1 to 200 revolutions per minute is preferred, and a rotational speed of 5 to 50 revolutions per minute is particularly preferred, especially most preferably 10 revolutions per minute.

The circular movement can be carried out within the purifying liquid or else partially outside the purifying liquid. If a circular movement is performed in the course of which dipping into and out of the liquid takes place, the process basin can in this case be moved wholly or partly out of the liquid. Preference is given to a circular movement with dipping into and out of the liquid, the process basin being continually filled and emptied.

In a further embodiment of the method according to the invention, the improvement in the flow conditions between the contact points of the individual fragments is produced by applying ultrasound. Surprisingly, it was possible to show that by applying ultrasound having an operating frequency range of 10 kHz to 5 GHz the attack on silicon in the HF/HN03 etchant is surprisingly considerably increased. An operating frequency of 500 kHz to 2 GHz is preferred. An operating frequency of 1 GHz is particularly preferred. In the bulk material the ultrasound has a positive effect on the etching process and on the dissolution of the metal particles. The metal surface values can be significantly reduced and it was thus possible to obtain the same effect as at flow velocities of greater than 100 mm/sec.

Surprisingly, using the ultrasound technique, acid residues can be better rinsed out of cracks in poly fragments in both the acid and the rinsing baths.

All the arrangements according to the invention described made it possible for the purifying liquid to flow through the polysilicon bulk material from more than 2 different directions at a velocity of greater than 100 mm/sec. In this case, there is uniform flow through the contact points in the bulk material and, on the purified polysilicon, spots do not occur on the fragments nor can appreciable acid residues be detected.

The invention will be explained in greater detail on the basis of the following examples.

Carrying Out the CE Measurements/Ion Chromatography Measurements:

5 kg of poly fragments were filled in a closed plastic container with 100 ml of ultrapure water. The closed container is left for one week. Afterward the fluoride, nitrate, nitrite and chloride content was measured by means of an ion chromatography measurement or capillary electrophoresis.

Carrying Out the Metal Analyses on the Purified Poly Fragments:

In a Teflon funnel, polysilicon having a weight of 100 g was sprayed with 40 ml of HF/HN03 1:4. The etching acid was collected in a Teflon bowl. Afterward, the acid was evaporated and the residue taken up in 5 ml of water. The metal content of the aqueous solution is measured on the ICP-AES (inductively coupled ion plasma atomic emission spectroscope from Spectro). The metal content of the polysilicon surface is calculated from the measured values. The data were given in pptw.

Comparative Example 1

Influence of the Flow on the Etching Removal and Spots in a Lifting/Lowering Apparatus The influence of the flow in the etching tank on the etching removal and the spots was investigated on the basis of the lifting/lowering method for purifying poly fragments as described in EP 0905 796. In this method, the flow onto the polysilicon fragments is produced by an up and down movement of the process basin filled with poly fragments. The acid circulates in a vertical direction from the bottom upward.

The relationship between the flow onto the poly surface that results from the up and down movement and circulation, and the etching removal can be gathered from Table 1 below.

Purifying solution used: 5% by weight HF, 55% by weight $HNO_3$ and 8% by weight $H_2SiF_6$; temperature in the etching bath 20° C.

TABLE 1

| Total of the flow onto the poly fragments | Silicon removal |
| --- | --- |
| 0 mm/sec | 0.6 μm/min. |
| 10 mm/sec | 2.5 μm/min. |
| 30 mm/sec | 4.3 μm/min. |
| 50 mm/sec | 5.5 μm/min. |
| 70 mm/sec | 5.7 μm/min. |
| 90 mm/sec | 5.8 μm/min. |
| 100 mm/sec | 5.8 μm/min. |

Purifying solution used: 5% by weight HF, 55% by weight $HNO_3$ and 8% by weight $H_2SiF_6$; temperature in the etching bath 20° C.

The table shows that with a lifting/lowering apparatus, at a flow of greater than 50 mm/sec onto the polysilicon surface, the etching removal no longer appreciably increases. With a lifting/lowering apparatus, flow velocities up to a maximum 100 mm/sec are possible on an industrial scale for production installations with a tenable financial outlay. At flow velocities up to 100 mm/sec, however, gray spots are obtained as a result of the excessively small substance exchange in the dead water zones.

The purified poly fragments contained the following analysis values from ion chromatography or CE measurements: fluoride 2 pptw, nitrate 5 pptw, nitrite 0.1 pptw and chloride 3 pptw.

Example 1

Flow Through Alternate Nozzles

A polysilicon rod was comminuted and classified by means of a device comprising a comminuting tool and a screening device. 5 kg of poly fragments were treated in a process basin using the following 3-stage purifying process analogously to EP 0 905 796. For preliminary purifying, the polysilicon fragments were purified for 20 minutes in a mixture comprising $HF/HCl/H_2O_2$ at a temperature of 25° C. During the subsequent main purifying, the polysilicon fragments were etched for 5 minutes at 8° C. in a mixture of $HF/HNO_3$. This was followed by rinsing for 5 minutes in ultrapure water with 18 megohms at a temperature of 22° C. Finally, hydrophilization was effected for 5 minutes in a mixture comprising $HCl/H_2O_2$ at a temperature of 22° C. and drying was effected for 60 minutes using ultrapure air of class 100 at 80° C.

During the preliminary purifying, in the rinsing baths and during the hydrophilization, the basket containing a weighed-in quantity of 5 kg carried out an up and down movement with the poly fragments with a stroke frequency of 5 strokes per minute.

The main purifying took place in an etching bath with 500 l of acid, in which 50 nozzles were situated. The $HF/HNO_3$ etching mixture emerged from the nozzles at a velocity of 150 mm/sec. The nozzles were opened in temporally staggered fashion in an alternating cycle with a temporal delay of 2 sec for a time of 0.5 sec. The nozzles had an opening of 1 mm. The alternate incident flow on the individual fragments prevented dead water zones from arising at the contact points between the poly fragments. A uniform flow velocity prevails at all points in the bulk material. After the hydrophilization and drying, poly fragments without spots on their lustrous surfaces were obtained.

Example 2

Etching in Rotating Acid

A procedure analogous to example 1 was employed.

In a departure therefrom, during the main purifying, the process basin in a 500 liter $HF/HNO_3$ etching mixture in the acid tank was moved with a lifting/lowering movement at a frequency of 5 strokes per minute. Four nozzles having an exit opening of 1 mm were fitted at the base of the tank. The acid emerged from said nozzles at a velocity of 150 mm/sec. During the lifting/lowering movement, the basin continually completely emerged from the acid and entered it again. The acid had a temperature of 8° C. As a result of the rotating acid, a uniform throughflow was achieved at all points in the bulk material. This made it possible to prevent dead water zones at the contact points between the poly fragments.

After the hydrophilization and drying, poly fragments without spots on their lustrous surfaces were obtained.

Example 3

Horizontal Turntable

A procedure analogous to example 1 was employed.

In a departure therefrom, during the main purifying, the process basin in a 500 liter $HF/HNO_3$ etching mixture in the acid tank was rotated on a turntable in a horizontal direction. The rotary movement was 50 revolutions per minute. An incident flow from different directions onto the surface of the individual fragments of 150 mm/sec was produced by the horizontal rotary movement at the rotational speed specified. This made it possible to prevent dead water zones at the contact points between the poly fragments. After the hydrophilization and drying, poly fragments without spots on their lustrous surfaces were obtained.

Example 4

Diffuse Injection of Air

A procedure analogous to example 1 was employed.

In a departure therefrom, during the main purifying, the process basin in a 500 liter $HF/HNO_3$ etching mixture in the acid tank was moved with a lifting/lowering movement at a frequency of 5 strokes per minute. 50 nozzles having an opening of 0.1 mm were additionally fitted at the base of the tank. Through these nozzles, air was additionally injected through the base of the basin. This made it possible to achieve an increase in the flow velocity at the contact points. The flow velocity was 150 mm/sec. The nozzles were opened with a temporal delay of 2 sec for 0.5 sec. As a result of the additional turbulence produced by the injected air, the acid can flow through unimpeded at all contact points between the poly fragments.

After the hyrophilization and drying, poly fragments without spots on their lustrous surfaces were obtained.

Example 5

Vertical Movement of the Process Basin

A procedure analogous to example 1 was employed.

In a departure therefrom, during the main purifying, the process basin in a 500 liter $HF/HNO_3$ etching mixture was moved with a vertical circular movement through the acid tank. The frequency of the circular movement was 10 revolutions per minute. As a result, the acid flows onto the poly surfaces at a velocity of 150 mm/sec from all directions. The bath temperature was 8° C. and there was continuous circulation. The time in the etching bath was 5 minutes. During the circular movement, the basin was completely immersed in the liquid and completely removed therefrom in each cycle. The circular movement results in uniform flow through the bulk material which prevents dead water zones from arising at the contact points of the poly fragments. After the hydrophilization and drying, poly fragments without spots on their lustrous surfaces were obtained.

Example 6

Flow Using Ultrasound

A polysilicon rod was comminuted and classified by means of a device comprising a comminuting tool and a screening device. 5 kg of poly fragments were treated in a process basin using the following 3-stage purifying process analogously to EP 0 905 796. For preliminary purifying, the polysilicon fragments were purified for 20 minutes in a mixture comprising $HF/HCl/H_2O_2$ at a temperature of 25° C. During the subsequent main purifying, the polysilicon fragments were etched for 5 minutes at 8° C. in a mixture of $HF/HNO_3$. This was followed by rinsing for 5 minutes in ultrapure water with 18 megohms at a temperature of 22° C.

Finally, hydrophilization was effected for 5 minutes in a mixture comprising $HCl/H_2O_2$ at a temperature of 22° C. and drying was effected for 60 minutes using ultrapure air of class 100 at 80° C.

During the preliminary purifying, during the $HF/HNO_3$ main purifying, in the rinsing baths and during the hydrophilization, the basket filled with 5 kg of poly fragments carried out an up and down movement with a stroke frequency of 5 strokes per minute. An ultrasonic generator having an operating frequency of 1 GHZ was additionally incorporated in all purifying and rinsing steps.

Poly fragments with fewer particles in comparison with a process without an ultrasound bath and with a lower metal level on the poly surface were obtained after the end of the process. The purified polysilicon fragments had no spots on their lustrous surfaces.

Example 7

Rinsing Bath With Ultrasound

In an ultrasound bath, poly fragments were introduced into a plastic tub with 18 Mohm water for several minutes. By applying ultrasound with an operating frequency range of 3 GHZ, it was possible to remove acid residues situated in a rough poly surface having cracks smaller than 5µ after etching using $HF/HNO_3$. As a comparison, an attempt was made to completely remove acid residues on the poly fragments in a normal throughflow tank with 18 Mohm water. The residual acid content from both approaches was determined by the ion chromatography method or the CE method.

| Cracked poly from normal rinsing | | Cracked poly from ultrasonic rinsing | |
|---|---|---|---|
| Fluoride | 2 pptw | Fluoride | <DL (1 pptw) |
| Nitrate | 5 pptw | Nitrate | <DL (2 pptw) |
| Nitrite | 0.1 pptw | Nitrite | <DL (0.01 pptw) |
| Chloride | 3 pptw | Chloride | <DL (1 pptw) |

Example 8

Rinsing Baths With 3 GHZ Ultrasound

A polysilicon rod was comminuted and classified by means of a device comprising a comminuting tool and a screening device. 5 kg of poly fragments were treated in a process basin by means of the following purifying process.

For preliminary purifying, the polysilicon fragments were purified for 20 minutes in a mixture comprising 5% by weight HF, 8% by weight HCl and 3% by weight $H_2O_2$ at a temperature of 25° C. The removal of the polysilicon surface was 0.02µ in this case.

Afterward, rinsing was effected for 5 minutes at 3 m$^3$/hr in an ultrasound bath with plastic lining at 3 GHZ at 22° C. During the subsequent main purifying the polysilicon fragments were etched for 5 minutes at 8° C. in a mixture of $HF/HNO_3$ comprising 3% by weight HF, 65% by weight $HNO_3$. The etching removal was approximately 12 µm.

Afterward rinsing was effected for 5 minutes at 2 m$^3$/hr in an ultrasound bath with a plastic lining at 3 GHZ at 22° C. The polysilicon fragments were subsequently hydrophilized in a further step in a mixture comprising $HCl/H_2O_2$ comprising 8% by weight HCl and 2% by weight $H_2O_2$ for 5 minutes at 22° C.

Afterward, rinsing was effected for 5 minutes at 1 m$^3$/hr at 3 GHZ at 22° C. and at 80° C. for a further 5 minutes at 4 m$^3$/hr in an ultrasound bath with plastic lining. Drying was then effected for 60 minutes using ultrapure air of class 100 at 80° C.

Ion chromatography measurements or CE measurements show that the purified poly fragments contain acid residues below the detection limit.

The following metal surface values were obtained in this case:

| Element | Concentration |
|---|---|
| Fe | 13 pptw |
| Cr | 1 pptw |
| Ni | 1 pptw |
| Na | 12 pptw |
| Zn | 8 pptw |
| Al | 8 pptw |
| Cu | 2 pptw |
| Mo | 0 pptw |
| Ti | 8 pptw |
| W | 1 pptw |
| K | 5 pptw |
| Co | 0 pptw |
| Mn | 0 pptw |

-continued

| Element | Concentration |
|---|---|
| Ca | 25 pptw |
| Mg | 8 pptw |
| V | 0 pptw |

Comparative Example 2

Rinsing Baths without 3 GHZ Ultrasound

A procedure analogous to example 8 was employed, but the assistance of ultrasound was dispensed with during the rinsing steps.

Ion chromatography measurements or CE measurements show that the purified poly fragments still contain acid residues.

The following metal surface values were obtained in this case:

| Element | Concentration |
|---|---|
| Fe | 13 pptw |
| Cr | 1 pptw |
| Ni | 1 pptw |
| Na | 24 pptw |
| Zn | 8 pptw |
| Al | 28 pptw |
| Cu | 2 pptw |
| Mo | 0 pptw |
| Ti | 23 pptw |
| W | 1 pptw |
| K | 5 pptw |
| Co | 0 pptw |
| Mn | 0 pptw |
| Ca | 45 pptw |
| Mg | 11 pptw |
| V | 0 pptw |

The invention claimed is:

1. A method for reducing metallic contamination in polycrystalline silicon fragments, comprising:
etching surfaces of the polycrystalline silicon fragments in a main cleaning by introducing the polycrystalline silicon fragments, contained within a container, into an etching tank containing a purifying liquid which etches and removes silicon and dissolves metal contaminants, wherein the purifying liquid contacts the surface of the polycrystalline silicon fragments from more than two different directions at a flow velocity of greater than 100 mm/s, and wherein purified polycrystalline silicon fragments with a reduced concentration of metallic impurities and which are free of gray spots, are obtained, and wherein flow of purifying liquid from more than two directions is produced by rotating at least one ring which is vertically oriented around a horizontal axis, the ring containing a plurality of purifying liquid injection nozzles oriented towards the container.

2. The method of claim 1, wherein the injection nozzles in the ring are operated in a temporally staggered fashion.

* * * * *